US012387120B1

(12) United States Patent
Foxen

(10) Patent No.: US 12,387,120 B1
(45) Date of Patent: Aug. 12, 2025

(54) DISCRETE PULSE SETTLING COMPENSATION FOR COMPOSITE QUANTUM GATES

(71) Applicant: Google LLC, Mountain View, CA (US)

(72) Inventor: Brooks Riley Foxen, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 1200 days.

(21) Appl. No.: 17/097,152

(22) Filed: Nov. 13, 2020

Related U.S. Application Data

(60) Provisional application No. 62/935,946, filed on Nov. 15, 2019.

(51) Int. Cl.
*G06N 10/20* (2022.01)
*G06N 10/00* (2022.01)
*H03K 3/38* (2006.01)

(52) U.S. Cl.
CPC .............. *G06N 10/20* (2022.01); *H03K 3/38* (2013.01)

(58) Field of Classification Search
CPC ........ G06N 10/00; G06N 10/20; G06N 10/40; G06N 10/60; G06N 10/70; G06N 10/80
See application file for complete search history.

(56) References Cited

U.S. PATENT DOCUMENTS 10,452,991 B1 * 10/2019 Ganzhorn .............. B82Y 10/00
2024/0070502 A1 * 2/2024 Ethier-Majcher ...... G06N 10/20

OTHER PUBLICATIONS

Neill et al., "A Blueprint for Demonstrating Quantum Supremacy with Superconducting Qubits", Sep. 19, 2017, Arxiv.org. pp. 1-22 (URL: https://arxiv.org/abs/1709.06678) (Year: 2017).*
Foxen et al., "High Speed Flux Sampling for Tunable Superconducting Qubits with an Embedded Cryogenic Transducer", Superconductor Science and Technology, vol. 32, 2019, 11 pages.
Neill et al., "Supplementary Materials for a Blueprint for Demonstrating Quantum Supremacy with Superconducting Qubits", Science, vol. 360, Apr. 13, 2018, 21 pages.
Rol et al., "Fast, High-Fidelity Conditional-Phase Gate Exploiting Leakage Interference in Weakly Anharmonic Superconducting Qubits", Pysical Review Letters, vol. 123, 2019, 6 pages.

* cited by examiner

*Primary Examiner* — Paulinho E Smith
(74) *Attorney, Agent, or Firm* — DORITY & MANNING, P.A.

(57) ABSTRACT

Quantum computing systems and methods are provided. In one example, the method includes applying a first control pulse to implement a first quantum gate in a set of sequential quantum gates implemented in a quantum computing system. The first control pulse has a first amplitude. Subsequent to applying the first control pulse, the method includes applying a second control pulse to implement a second quantum gate in the set of sequential quantum gates. The second control pulse has a second amplitude. The second amplitude is determined based at least in part on the first amplitude of the first control pulse, for instance, to reduce an effect attributable to a settling time associated with the first control pulse during applying of the second control pulse.

14 Claims, 7 Drawing Sheets

DISCRETE PULSE SETTLING COMPENSATION FOR COMPOSITE QUANTUM GATES

PRIORITY CLAIM

The present application claims the benefit of priority of U.S. Provisional Patent Application Ser. No. 62/935,946, filed on Nov. 15, 2019, titled "Discrete Pulse Settling Compensation for Composite Quantum Gates," which is incorporated herein by reference.

FIELD

The present disclosure relates generally to quantum computing systems.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$ The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a method for implementing a set of quantum gates in a quantum computing system. The method includes applying a first control pulse to implement a first quantum gate in a set of sequential quantum gates implemented in a quantum computing system. The first control pulse has a first amplitude. Subsequent to applying the first control pulse, the method includes applying a second control pulse to implement a second quantum gate in the set of sequential quantum gates. The second control pulse has a second amplitude. The second amplitude is determined based at least in part on the first amplitude of the first control pulse, for instance, to reduce an effect attributable to a settling time associated with the first control pulse during applying of the second control pulse.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
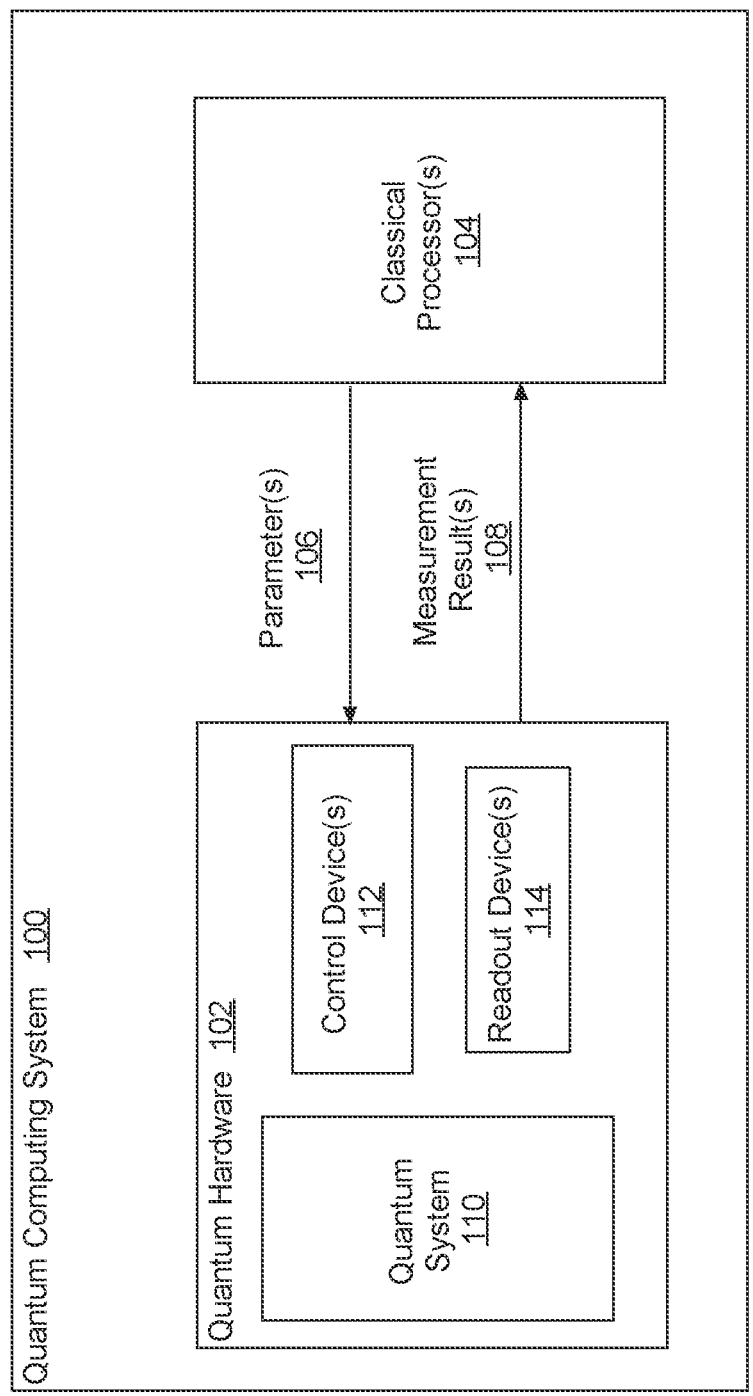
FIG. 1 depicts an example quantum computing system according to example embodiments of the present disclosure.

Example aspects of the present disclosure are directed to systems and methods for implementing quantum gates in a quantum computing system. More particularly, a quantum computing system can implement one or more quantum gates to perform operations on one or more qubits in the quantum system. The quantum gates can be implemented by providing control pulses (e.g., via control bias) that affect the one or more qubits to transform or modify a state of the one or more qubits and/or a coupling between qubits.

For example, a quantum computing system can include flux qubits (e.g., transmon qubits, gmon qubits) that allow for applied magnetic fields (e.g., generated by a control signal running a current or voltage through a nearby control wire) to adjust a frequency of the qubits. In some implementations, the flux qubits can be implemented using superconducting quantum interference devices (SQUIDs) having magnetic-flux-tunable inductances. Some quantum computing systems can include qubits with tunable coupling between the qubits (e.g., referred to as a gmon qubit or tunable coupling transmon qubit). For tunable coupling qubits, applied magnetic fields (e.g., generated by a control signal running a current or voltage through a nearby control wire) can adjust the coupling between qubits.

Quantum computing applications can require the implementation of a sequence of quantum gates. This can be implemented using flux controlled qubits by providing a sequence of control pulses to implement the quantum gates. A challenge with such a control scheme is precisely measuring and compensating for non-idealities in the transfer function between the control electronics and the qubits. In situ measurements can be used to measure this transfer function to pre-distort control pulses accordingly with varying levels of success. The result can be an imperfect compensation and non-ideal control waveforms that may have long settling times. For example, a 15 nanosecond square control pulse with amplitude of about 1 may have a settling time with amplitude of about 0.01 that lasts for several hundred nanoseconds or longer.

The operation of a gate-based quantum computing systems can require the sequential application of discrete gates. Long settling times on the control pulses can affect downstream gates, leading to increased errors in quantum computing. The settling times can have particularly large effects on coupler quantum gates because coupling strength between qubits can be particularly sensitive to the amplitude of the control pulse. Even a little bleed through of a settling time from a preceding control pulse can have a large effect on coupling strength implemented by a downstream quantum gate.

According to example aspects of the present disclosure, a control scheme for implementing a set of sequential quantum gates can provide for compensation of an amplitude of a control pulse for implementing an n quantum gate in a set of quantum gates based at least in part on an amplitude of the control pulse of the n-1 quantum gate in the set of quantum gates. For example, a method can include applying a first control pulse to implement a first quantum gate in a set of sequential quantum gates implemented in a quantum computing system. The first control pulse can have a first amplitude. Subsequent to applying the first control pulse, the method can include applying a second control pulse to implement a second quantum gate in the set of sequential quantum gates. The second control pulse can have a second amplitude. The second amplitude can be determined based at least in part on the first amplitude of the first control pulse, for instance, to reduce an effect attributable to a settling time associated with the first control pulse during applying of the second control pulse. This procedure may be applied to an arbitrary sequence of n quantum gates, by first adjusting the second gate's amplitude based on the first, then the third gate's amplitude based on the adjusted second gate's amplitude, and so on where by the nth gate amplitude is adjusted based on the adjusted amplitude of the preceding (n−1)th gate.

In some embodiments, the second control pulse can be an idle control pulse (e.g. zero amplitude) prior to adjustment of the second control pulse according to example aspects of the present disclosure. This can occur, for instance, when a flux control line is idle, but other control pulses are provided via other control lines and/or other gates are being implemented with microwave control pulses. The idle control pulse can be adjusted to have a second amplitude determined based at least in part on an amplitude of the preceding control pulse to compensate for settling time of the first control pulse, even when the control pulse would otherwise be idle. As one example, consider a sequence of three control pulses of amplitudes $A_0$, $A_1$, and $A_2$ respectively to implement three quantum gates and where $A_2$ is initially zero or idle. $A_1$ can be adjusted based on $A_0$. $A_2$ can be adjusted based on $A_1$ to compensate for a settling time associated with $A_1$.

In some embodiments, the first quantum gate and/or the second quantum gate can be multi-qubit quantum gates (e.g., two qubit quantum gates) configured to perform operations on multiple qubits (e.g., two qubits). In some embodiments, the first quantum gate and the second quantum gate can implement a coupler between two qubits to control coupling between the qubits in the quantum computing system. For instance, the first control pulse and the second control pulse can be applied to the coupler to control the coupling between the first qubit and the second qubit in the quantum computing system during implementation of the first quantum gate and the second quantum gate. In some embodiments, the first quantum gate and/or the second quantum gate can be single qubit gates.

In some embodiments, the second amplitude of the second control pulse can be determined by accessing a model correlating the second amplitude with the first amplitude of the first control pulse (e.g., an adjustment to the second amplitude of the second control pulse). In an example implementation, the model can be determined by performing operations. The operations can include, for instance, applying a first calibration pulse (e.g., a positive calibration pulse) and determining a first compensation adjustment to the second control pulse to compensate for the first calibration pulse. The operations can include, for instance, applying a second calibration pulse (e.g., a negative calibration pulse) and determining a second compensation adjustment to the second control pulse to compensate for the second calibration pulse. The model can be determined based at least in part on the first compensation adjustment and the second compensation adjustment, for instance, using an interpolation (e.g., a linear interpolation).

Aspects of the present disclosure can provide a number of technical effects and benefits and can provide improvements to quantum computing technology. For instance, the control scheme according to example embodiments of the present disclosure can reduce effects of settling times on downstream quantum gates, leading to reduced errors in quantum computing. In addition, the control scheme can reduce a need for long separation times between implementation of discrete quantum gates, leading to faster processing times.

With reference now to the FIGS., example embodiments of the present disclosure will be discussed in further detail. As used here, the use of the term "about" in conjunction with a value refers to within 20% of the value.

FIG. 1 depicts an example quantum computing system 100. The example system 100 is an example of a system implemented as classical or quantum computer program on one or more classical computers or quantum computing devices in one or more locations, in which the systems, components, and techniques described below can be implemented. FIG. 1 depicts an example quantum computing system that can be used to implement aspects of the present disclosure. Those of ordinary skill in the art, using the disclosures provided herein, will understand that other quantum computing structures or systems can be used without deviating from the scope of the present disclosure.

The system 100 includes quantum hardware 102 in data communication with one or more classical processors 104. The quantum hardware 102 includes components for performing quantum computation. For example, the quantum hardware 102 includes a quantum system 110, control device(s) 112, and readout device(s) 114 (e.g., readout resonator(s)). The quantum system 110 can include one or more multi-level quantum subsystems, such as a register of qubits. In some implementations, the multi-level quantum subsystems can include superconducting qubits, such as flux qubits, charge qubits, transmon qubits, gmon qubits, etc.

The type of multi-level quantum subsystems that the system 100 utilizes may vary. For example, in some cases it may be convenient to include one or more readout device(s)

114 attached to one or more superconducting qubits, e.g., transmon, flux, gmon, xmon, or other qubits.

Quantum circuits may be constructed and applied to the register of qubits included in the quantum system 110 via multiple control lines that are coupled to one or more control devices 112. Example control devices 112 that operate on the register of qubits can be used to implement quantum logic gates or circuits of quantum logic gates, e.g., Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines to generate magnetic fields to adjust a frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum system 102 through physical control parameters (e.g., microwave pulse) that are sent through wires included in the quantum hardware 102. Further examples of control devices include arbitrary waveform generators, wherein a DAC creates the signal.

The readout device(s) 114 may be configured to perform quantum measurements on the quantum system 110 and send measurement results 108 to the classical processors 104. In addition, the quantum hardware 102 may be configured to receive data specifying physical control parameter values 106 from the classical processors 104. The quantum hardware 102 may use the received physical control parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

The readout device(s) 114 can take advantage of a difference in the impedance for the $|0\rangle$ and $|1\rangle$ states of an element of the quantum system, such as a qubit, to measure the state of the element (e.g., the qubit). For example, the resonance frequency of a readout resonator can take on different values when a qubit is in the state $|0\rangle$ or the state $|1\rangle$, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

Figure 2:
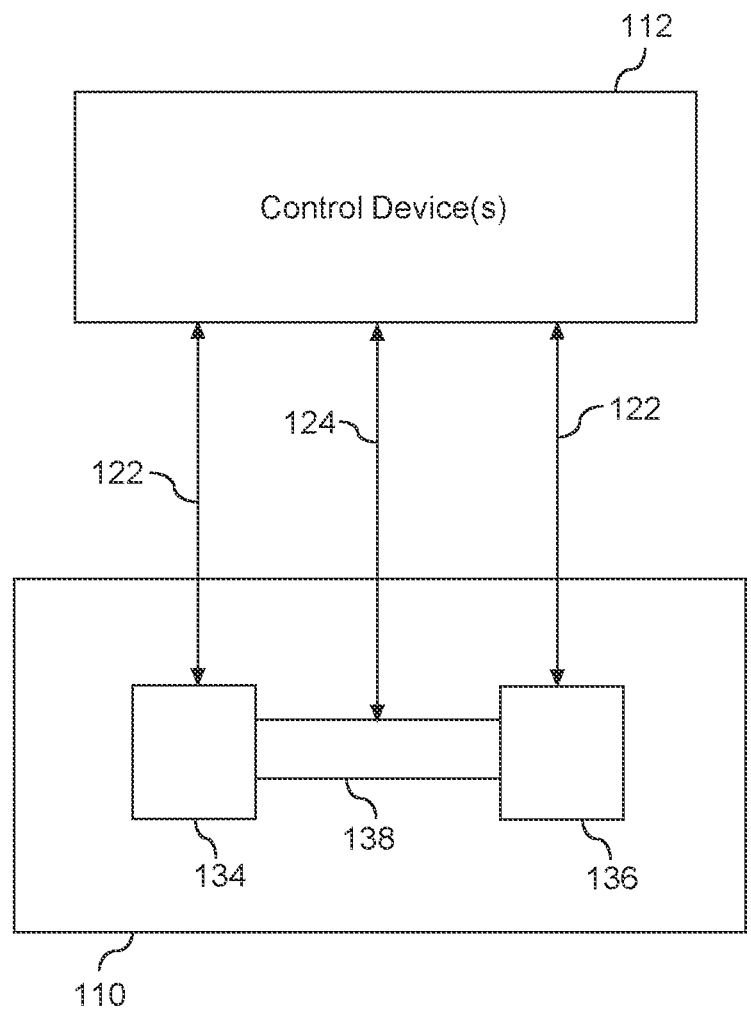
FIG. 2 depicts an example quantum system operable to implement a quantum gate according to example aspects of the present disclosure.

FIG. 2 depicts example control of a quantum system 110 to implement a quantum gate according to example embodiments of the present disclosure. The quantum system 110 includes at least a first qubit 134, a second qubit 136, and a tunable coupler 138 between the first qubit 134 and the second qubit 136. The first qubit 1034, the second qubit 136, and the tunable coupler 138 may be subcomponents of the quantum system 110. For example, quantum system 110 may include additional components for performing quantum or classical computations, e.g., additional qubits, additional tunable couplers, additional control electronics and processors.

Each of the first qubit 134, the second qubit 136, and the tunable coupler 138 are frequency-tunable. In some implementations the first qubit 134 and the second qubit 136 may be superconducting qubits. For example, the first qubit 134 and the second qubit 136 may be transmon qubits. In other implementations other qubit architectures may be used instead. Various different tunable coupler designs may be used. For example, in some implementations the tunable coupler 138 may include a three-terminal device constructed from superconductor materials using a fixed negative mutual inductance and a single, current-biased Josephson junction that acts as a tunable positive inductance.

The system includes control device(s) 112. Control device(s) 112 can operate the quantum hardware. For example, control device(s) 112 can include a waveform generator configured to generate control pulses according to example aspects of the present disclosure.

The system includes qubit control lines 122 from the control device(s) 112 to the first qubit 134 and the second qubit 136, respectively. For example, the frequency of the first qubit 134 and the second qubit 136 can be tuned by applying control signal(s) (e.g., a control pulse) using qubit control lines 122.

The system includes tunable coupler control line 124. Control device(s) 112 can dynamically tune the coupling or interaction between the first qubit 134 and the second qubit 136 by applying control signals (e.g., control pulses) to the tunable coupler control line 124 to tune the tunable coupler 138 frequency. For example, control device(s) 112 may apply a voltage or current pulse to the tunable coupler control line 124 to tune the tunable coupler 138 frequency.

In some implementations, the control device(s) 112 may include a data processing apparatus and associated memory. The memory may include a computer program having instructions that, when executed by the data processing apparatus, cause the data processing apparatus to perform one or more functions described herein, such as applying a control signal to a qubit 134/136 and/or to a tunable coupler 138.

Figure 3:
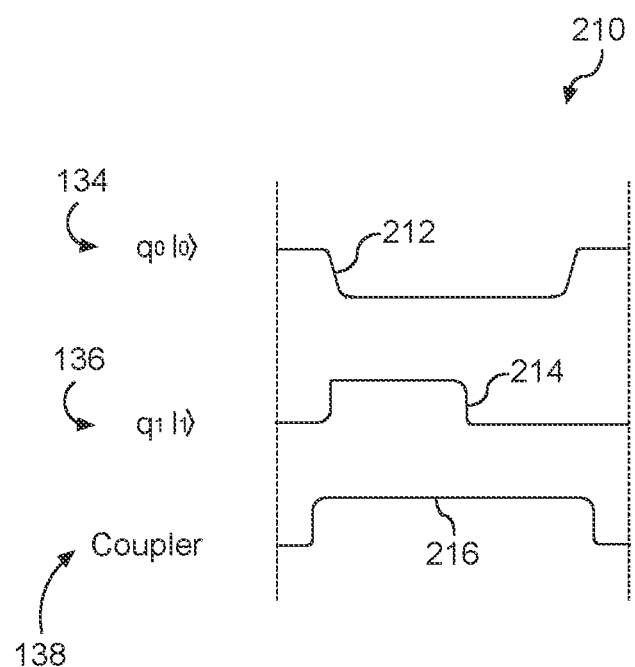
FIG. 3 depicts example control pulses for implementation of a quantum gate according to example aspects of the present disclosure.

FIG. 3 depicts a graphical representation of example implementation of a quantum gate 210 through application of control pulses. For instance, control pulse(s) 212, 214, 216 can be provided via control lines 122 and 124 to control the first qubit 134, the second qubit 136, and the tunable coupler 138 to implement a two qubit coupling quantum gate 210. For instance, control pulse 212 is applied to adjust frequency of a first qubit 134 (qubit $q_0$) during implementation of quantum gate 210. Control pulse 214 is applied to adjust frequency of a second qubit 136 (qubit $q_1$) during implementation of quantum gate 210. Control pulse 216 is applied to adjust the coupling between the first qubit 134 and the second qubit 136 during implementation of quantum gate 210.

Figure 4:
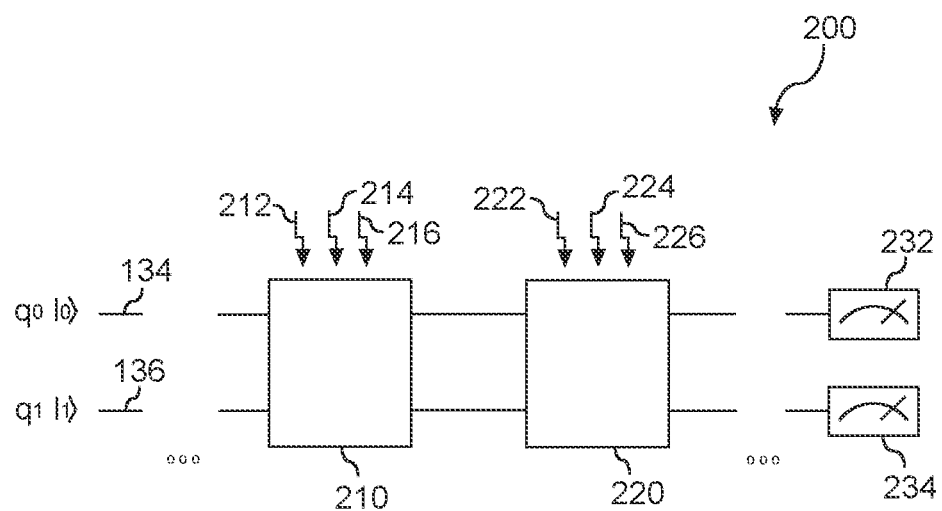
FIG. 4 depicts a wire representation of sequential quantum gates according to example embodiments of the present disclosure.

FIG. 4 depicts example implementation of sequential quantum gates on two qubits as part of a quantum operation 200. FIG. 4 depicts a wire representation of a portion of an example quantum operation 200 that include two sequential two qubit quantum gates. The two sequential quantum gates on two qubits can include, for instance, performing a two qubit interaction between both qubits, performing single qubit gates on one or both qubits, or performing an idle gate where the control pulses have zero amplitudes. The operation 200 can include other quantum gates without deviating from the scope of the present disclosure. The operation can include quantum gates occurring before and/or after the quantum gates illustrated in FIG. 4.

As shown, the operation 200 includes implementation of a first quantum gate 210 followed by a second quantum gate 220. The first quantum gate 210 can be, for instance, a swap quantum gate. The second quantum gate 220 can be, for instance, a controlled phase quantum gate. Other quantum gates and combinations of quantum gates can be used without deviating from the scope of the present disclosure, such as Hadamard gates, controlled-NOT (CNOT) gates, single qubit quantum gates, two qubit quantum gates, or other quantum gates. After implementation of the first quantum gate 210 and the second quantum gate 220, a measurement 232 can be performed for the first qubit 134 and a measurement 234 can be performed for the second qubit 136.

First control pulses 212, 214, and 216 can be provided from control device(s) to implement the first quantum gate 210 as discussed above. Subsequently, second control pulses 222, 224, and 226 can be provided from control device(s) to implement the second quantum gate 220. Settling tails from the first control pulse(s) 212, 214, and 216 can bleed over into second control pulses(s) 222, 224, and 226, causing errors in implementation of second quantum gate 220.

Figure 5:
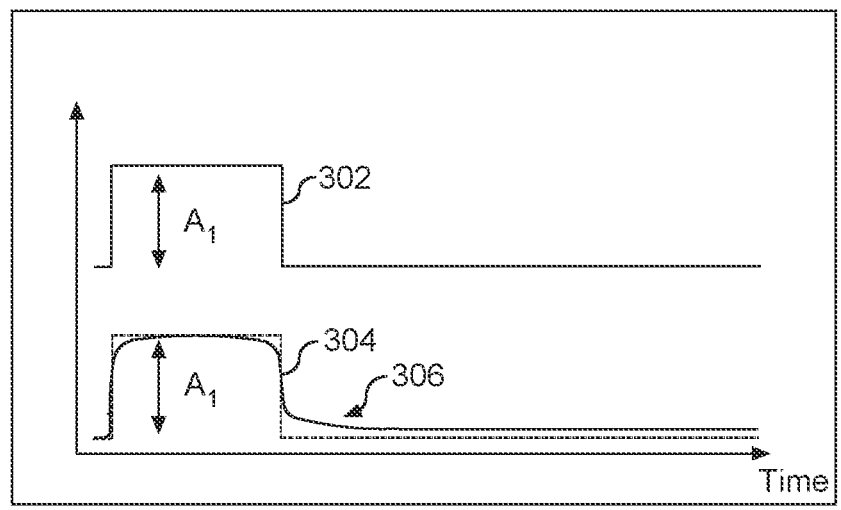
FIG. 5 depicts an example control pulse to be used during implementation of a quantum gate.

For instance, FIG. 5 depicts an ideal control pulse 302 having an amplitude $A_1$. The control pulse 302 can be a current pulse or a voltage pulse. The ideal control pulse 302 can have other defining characteristics, like desired bandwidth and/or providing a well defined rise and fall time. In some cases, a bandwidth limited control pulse can have a defined rise time (e.g., 2 ns) and a defined fall time (e.g., 2 ns). The control aspects to compensate for settling time effects according to example aspects of the present disclosure can be applied to compensate for known or intentional overlap of rise and fall times of sequential control pulses without deviating from the scope of the present disclosure. In these cases, for instance, the fall time can be considered part of the settling time of the control pulse.

FIG. 5 depicts a realstic control pulse 304. Due to physical aspects of the quantum computing system, the realistic control pulse 304 has rounded edges and can include a settling time 306. The settling time 306 is a non-zero voltage or current pulse that persists after ideal termination of the control pulse. This settling time 306 can affect subsequent control pulses provided for implementation of subsequent quantum gates. The amount the settling time can affect downstream control pulses and implementation of downstream quantum gates can be proportional to the integral of the settling time 306 (e.g., the area under the settling time 306). This is particularly true for control pulses applied to tunable couplers. In that regard, settling times 306 of small amplitude can still have a large effect on downstream control pulses and quantum gates.

Figure 6:
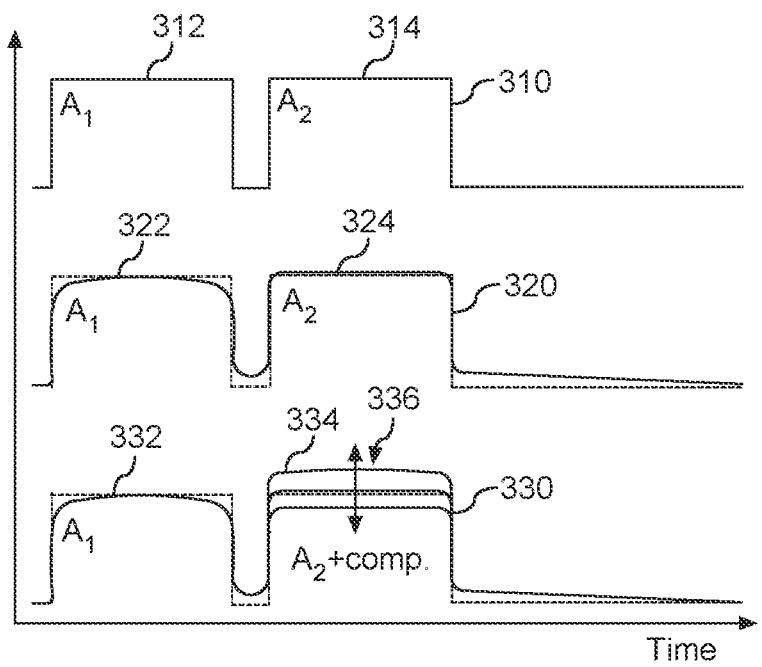
FIG. 6 depicts example sequential control pulses for implementation of sequential quantum gates according to example embodiments of the present disclosure.

FIG. 6 depicts a sequence of ideal control pulses 310, including a first control pulse 312 having a first amplitude $A_1$ and a second control pulse 314 having a second amplitude $A_2$. The ideal first control pulse 312 does not include a settling time. Accordingly, there is no need for compensation of the second control pulse 314 to achieve desired implementation of a downstream quantum gate using the second control pulse 314.

FIG. 6 further depicts a sequence of realistic control pulses 320 that include settling times. The sequence of realistic control pulses 320 includes a first control pulse 322 having a first amplitude $A_1$ and a second control pulse 334 having a second amplitude $A_2$. The settling time associated with the first control pulse 322 affects the shape of the second control pulse 324, leading to errors in implementation of a quantum gate with the second control pulse 324.

FIG. 6 further depicts a sequence of control pulses 330 used to implement sequential quantum gates according to example aspects of the present disclosure. More particularly, the sequence of control pulses 330 includes a first control pulse 332 having a first amplitude $A_1$ and a second control pulse 334 having a second amplitude $A_2$. According to example aspects of the present disclosure, the amplitude $A_2$ of the second control pulse 334 is adjusted by a compensation factor 336 that is determined based on the amplitude $A_1$ of the first control pulse 332. This can reduce the effect(s) of the settling time associated with the first control pulse 332 on the second control pulse 334.

In some embodiments, the amplitude $A_2$ (e.g., the compensation to amplitude $A_2$) for the second control pulse can be determined using a model correlating the amplitude $A_2$ of the second control pulse with the amplitude $A_1$ of the first control pulse. As used herein, a model correlating amplitude of the second control pulse with the amplitude of the first control pulse and a model correlating compensation to the amplitude of the second control pulse with the amplitude of the first control pulse falls within the scope of the term "model correlating the second amplitude of the second control pulse with the first amplitude of the first control pulse." The model can be implemented as a function, lookup table, algorithm, or other data correlating the second amplitude with the first amplitude.

Figure 7:
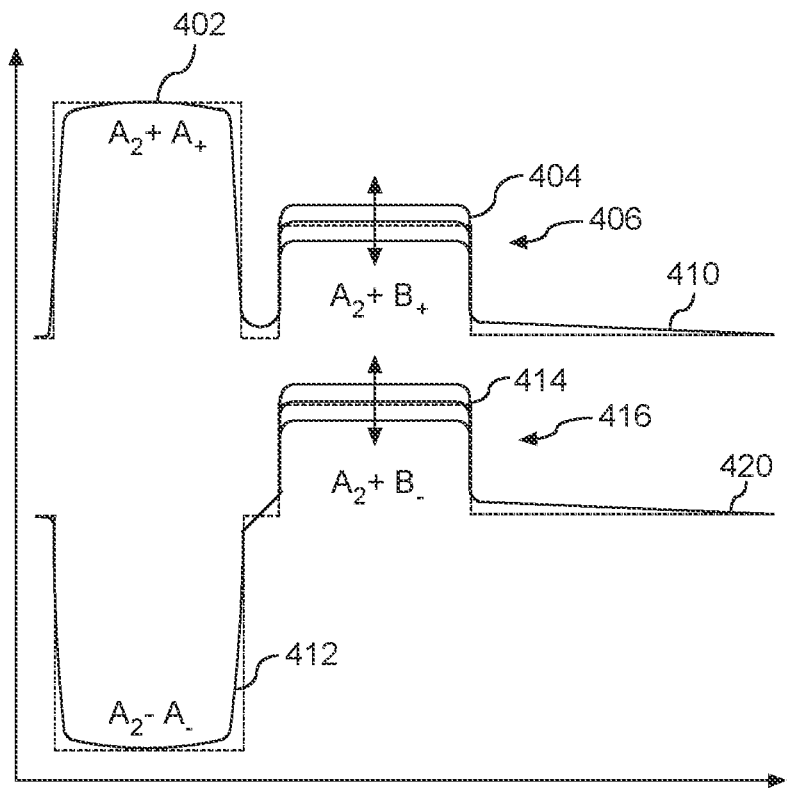
FIG. 7 depicts example determination of a model for adjustment of a control pulse for implementation of sequential quantum gates according to example embodiments of the present disclosure.

FIG. 7 depicts example determination of a model correlating the second amplitude of the second control pulse with the first amplitude of the first control pulse according to example aspects of the present disclosure. As shown, a first series of control pulses 410 can be applied to calibrate a sequence of quantum gates. The first series of control pulses 410 includes a first control pulse 402 and a second control pulse 404. The second control pulse 404 can have an initial amplitude $A_2$.

The first control pulse 402 can be a first calibration pulse. The first calibration pulse can be a positive control pulse with a positive amplitude. In some embodiments, the first calibration pulse can have amplitude $A_2+A_+$. $A_+$ can be an arbitrary value. In some embodiments, $A_+$ is selected such that $A_2+A_+$ is a maximum or near maximum amplitude (e.g., within 20% of maximum) that can be provided as a control pulse in the quantum system.

After application of the first control pulse 402, the second control pulse 404 can be provided with an adjustment 406 to the amplitude $A_2$. For instance, the second control pulse 404 can be adjusted by a first compensation adjustment $B_+$. The results can be measured to determine if a desired outcome of the sequence of quantum gates is achieved. If not, the second control pulse 404 can be further adjusted in either a positive or negative direction. The further adjustments can be determined in any suitable manner using any optimization algorithm or routine. The first series of control pulses 410 can be repeated until a first compensation adjustment $B_+$ is discovered that reduces settling time effects from the first control pulse 402 and such that the control pulse 404 provides its intended effect on the quantum system.

The above process can be repeated by applying a second series of control pulses 420 to calibrate the sequence of quantum gates. The second series of control pulses 420 includes a first control pulse 412 and a second control pulse 414. The second control pulse 414 can have an initial amplitude $A_2$.

The first control pulse 412 can be a second calibration pulse. The second calibration pulse can be a negative control pulse with a negative amplitude. In some embodiments, the second calibration pulse can have amplitude $A_2-A_-$. $A_-$ can be an arbitrary value. In some embodiments, $A_-$ is selected such that $A_2-A_-$ is a minimum or near minimum amplitude (e.g., within 20% of minimum) that can be provided as a control pulse in the quantum system.

After application of the first control pulse 412, the second control pulse 414 can be provided with an adjustment 416 to the amplitude $A_2$. For instance, the second control pulse 414 can be adjusted by a second compensation adjustment $B_-$. The results can be measured to determine if a desired outcome of the sequence of quantum gates is achieved. If not, the second control pulse 414 can be further adjusted in either a positive or negative direction. The further adjustments can be determined in any suitable manner using any optimization algorithm or routine. The second series of control pulses 420 can be repeated until a second compensation adjustment $B_-$ is discovered that reduces settling time effects from the first control pulse 412 and such that the control pulse 414 provides its intended effect on the quantum system.

Once the first compensation adjustment $B_+$ and the second compensation adjustment $B_-$ have been determined, a model can be determined based on the first compensation adjustment $B_+$ and the second compensation adjustment $B_-$ For instance, the model can be determined by using an interpolation between the first compensation adjustment $B_+$ and the second compensation adjustment B to correlate compensation adjustments with amplitudes of the first control pulse between $A_2+A_+$ and $A_2-A_-$. The interpolation can be any suitable interpolation, such as a linear interpolation. Other suitable methods can be used to generate the model without deviating from the scope of the present disclosure.

Figure 8:
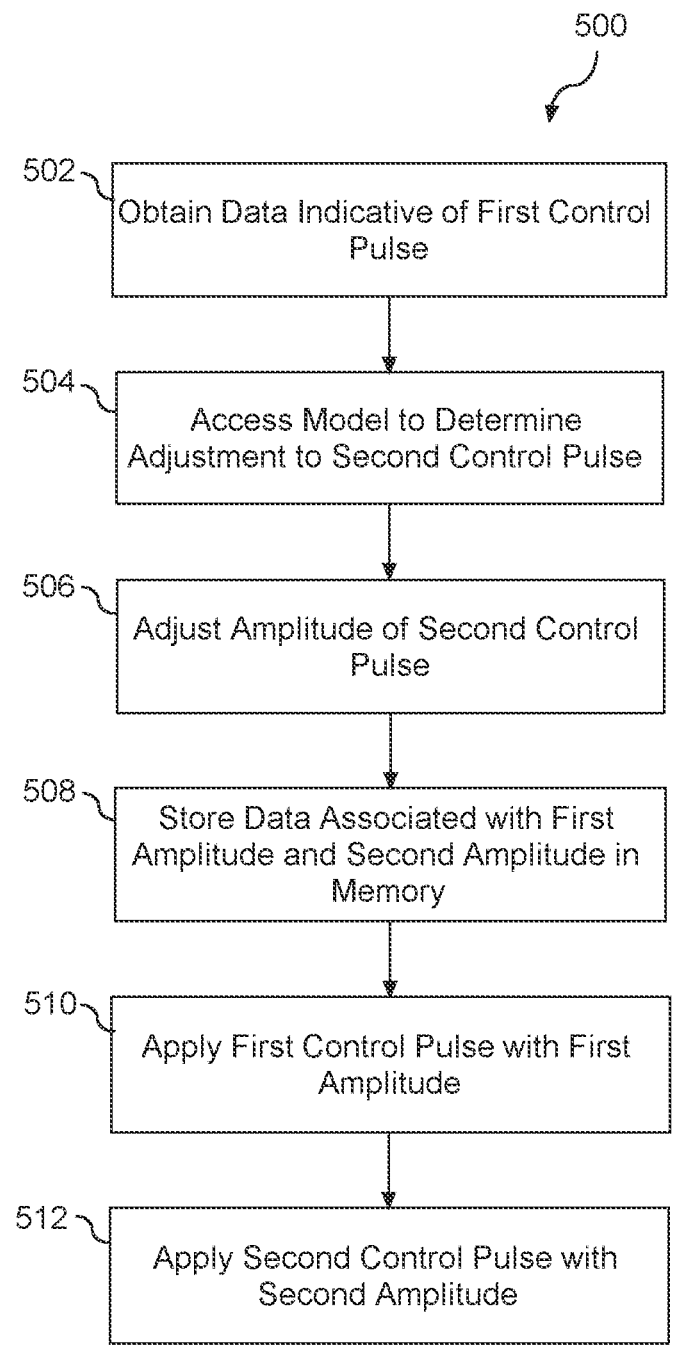
FIG. 8 depicts a flow diagram of an example method according to example embodiments of the present disclosure.

FIG. 8 depicts a flow diagram of an example method 500 according to example embodiments of the present disclosure. The method 500 can be implemented using any suitable quantum computing system, such as the quantum computing system depicted in FIGS. 1 and 2. FIG. 8 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

At 502, the method can include obtaining data indicative of a first control pulse to be applied to implement a first quantum gate in a series of quantum gates. The data can include data indicative of a first amplitude of the first control pulse.

At 504, the method can include accessing model correlating a second amplitude of a second control pulse with the first amplitude of the first control pulse. The model can be, for instance, a function, lookup table, algorithm, or other data correlating the second amplitude with the first amplitude.

At 506, the method can include adjusting the second amplitude of the second control pulse based on the model. The adjustment to the second amplitude can be determined as a function of the first amplitude of the first control pulse using the model. The adjustment can be operable to reduce effects attributable to settling times associated with the first control pulse.

At 508, the method can include storing data indicative of the first amplitude and the second amplitude in one or more memory devices. The data can be accessed by control device(s) to determine control pulses with the first amplitude the second amplitude respectively to implement a sequence of quantum gates.

At 510, the method can include applying the first control pulse to implement a first quantum gate. For instance, control device(s) 112 of FIG. 2 can apply the first control pulse to one or more of the first qubit 134, second qubit 136, or tunable coupler 138 to implement a first quantum gate (e.g., quantum gate 210 of FIG. 4). The first control pulse can have the first amplitude.

At 512, the method can include applying the second control pulse to implement a second quantum gate. For instance, control device(s) 112 of FIG. 2 can apply the second control pulse to one or more of the first qubit 134, second qubit 136, or tunable coupler 138 to implement a second quantum gate (e.g., quantum gate 220 of FIG. 4). The second control pulse can have the second amplitude adjusted based on the first amplitude.

Figure 9:
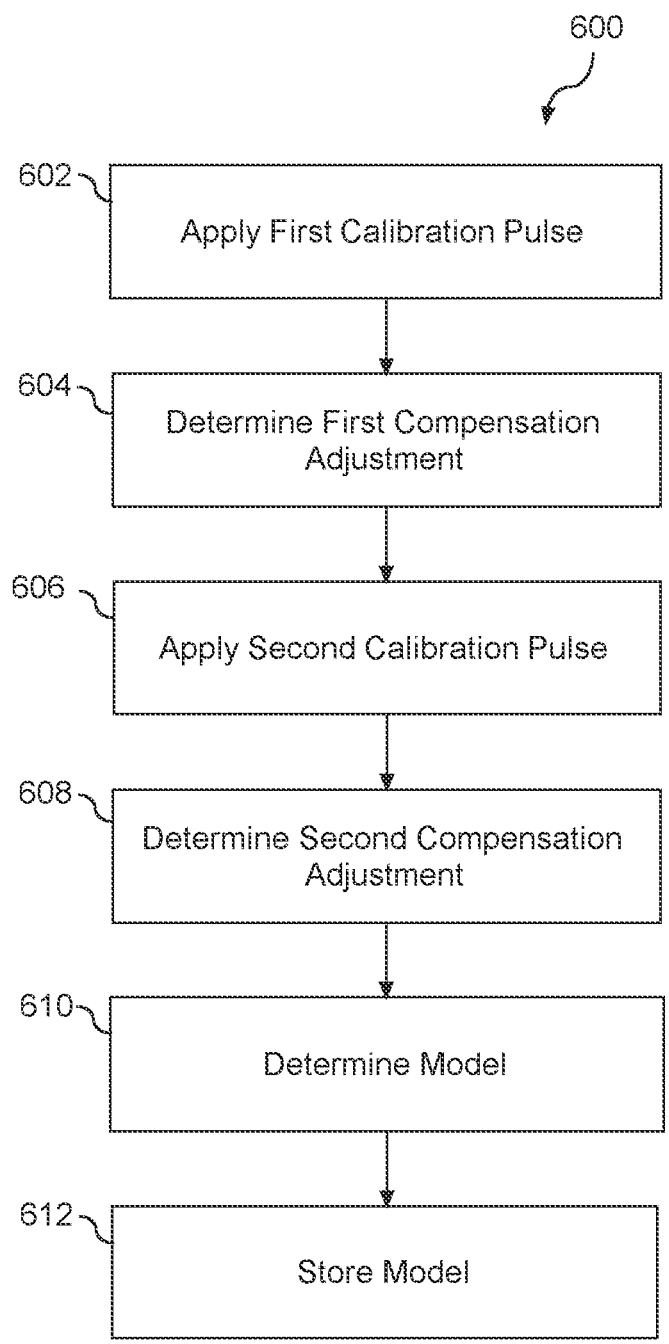
FIG. 9 depicts a flow diagram of an example method according to example embodiments of the present disclosure.

FIG. 9 depicts a flow diagram of an example method 600 of operations according to example embodiments of the present disclosure. The method 600 can be implemented using any suitable quantum computing system, such as the quantum computing system depicted in FIGS. 1 and 2. FIG. 9 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

At 602, the method includes applying a first calibration pulse. For instance, as shown in FIG. 7, the method can include applying a first control pulse 402 as the first calibration pulse. The first calibration pulse can be a positive control pulse with a positive amplitude. In some embodiments, the first calibration pulse can have amplitude $A_2+A_+$. $A_+$ can be an arbitrary value. In some embodiments, $A_+$ is selected such that $A_2+A_+$ is a maximum or near maximum amplitude (e.g., within 20% of maximum) that can be provided as a control pulse in the quantum system.

At 604, the method can include determining a first compensation adjustment to the second control pulse. For instance, a first compensation adjustment B-can be determined in the manner discussed with reference to FIG. 7. The operations 602 and 604 can be repeated until a suitable first compensation adjustment to reduce effects from settling times has been determined.

At 606, the method includes applying a second calibration pulse. For instance, as shown in FIG. 7, the method can include applying a first control pulse 412 as the second calibration pulse. The second calibration pulse can be a negative control pulse with a negative amplitude. In some embodiments, the second calibration pulse can have amplitude $A_2-A_-$. $A_-$ can be an arbitrary value. In some embodiments, $A_-$ is selected such that $A_2-A_-$ is a minimum or near minimum amplitude (e.g., within 20% of minimum) that can be provided as a control pulse in the quantum system.

At 608, the method can include determining a second compensation adjustment to the second control pulse. For instance, a second compensation adjustment $B_-$ can be determined in the manner discussed with reference to FIG. 7. The operations 606 and 608 can be repeated until a suitable second compensation adjustment to reduce effects from settling times has been determined.

At 610, the method can include determining a model correlating the second amplitude of the second control pulse with the first amplitude of the first control pulse based on the first compensation adjustment and the second compensation adjustment. For instance, a model can be determined by using an interpolation between the first compensation adjustment B+ and the second compensation adjustment B to correlate compensation adjustments with amplitudes of the first control pulse between $A_2+A_+$ and $A_2-A_-$. The interpolation can be any suitable interpolation, such as a linear interpolation. Other suitable methods can be used to generate the model without deviating from the scope of the present disclosure.

At 612, the method can include storing the model in a memory. The model can then be accessed for determining an amplitude of a second control pulse based on an amplitude of a first control pulse to reduce an effect attributable to a settling time associated with the first control pulse according to example embodiments of the present disclosure.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for implementing a set of quantum gates in a quantum computing system, the method comprising:
    applying a first control pulse on a first control line to implement a first quantum gate in a set of sequential quantum gates implemented in a quantum computing system, the first control pulse having a first amplitude; and
    subsequent to applying the first control pulse, applying a second control pulse on the first control line to implement a second quantum gate in the set of sequential quantum gates, the second control pulse having a second amplitude;
    wherein the second amplitude is determined based at least in part on the first amplitude of the first control pulse;
    wherein the second amplitude is determined by accessing a model correlating the second amplitude with the first amplitude; and
    wherein the model is determined by performing operations, the operations comprising:
        applying a first calibration pulse;
        determining a first compensation adjustment to the second control pulse to compensate for the first calibration pulse;
        applying a second calibration pulse;

determining a second compensation adjustment to the second control pulse to compensate for the second calibration pulse; and determining the model based at least in part on the first compensation adjustment and the second compensation adjustment, wherein determining the model based at least in part on the first compensation adjustment and the second compensation adjustment comprises performing an interpolation between the first compensation adjustment and the second compensation adjustment.

2. The method of claim 1, wherein the second amplitude is determined to reduce an effect attributable to a settling time associated with the first control pulse during applying of the second control pulse.

3. The method of claim 1, wherein the first quantum gate or the second quantum gate comprises a two qubit quantum gate.

4. The method of claim 1, wherein the quantum computing system comprises a coupler to control a coupling between a first qubit in the quantum computing system and a second qubit in the quantum computing system.

5. The method of claim 4, wherein the first qubit and the second qubit are implemented as coupling transmon qubits.

6. The method of claim 4, wherein the first control pulse and the second control pulse are applied to the coupler to control the coupling between the first qubit and the second qubit in the quantum computing system during implementation of the first quantum gate and the second quantum gate.

7. The method of claim 1, wherein the interpolation is a liner interpolation.

8. The method of claim 1, with the first calibration pulse has a positive amplitude and the second calibration pulse has a negative amplitude.

9. A quantum computing system, comprising:
 a first qubit;
 a second qubit;
 a tunable coupler configured to adjust a coupling between the first qubit and the second qubit;
 one or more control devices configured to apply a first control pulse via a first control line and a second control pulse subsequent to the first control pulse via the first control line to one or more of the first qubit, the second qubit, or the tunable coupler to implement a sequence of quantum gates, the sequence of quantum gates comprising a first quantum gate and a second quantum gate;
 wherein the first control pulse has a first amplitude and the second control pulse has a second amplitude, wherein the second amplitude is determined based at least in part on the first amplitude of the first control pulse;
 wherein the second amplitude is determined by accessing a model correlating the second amplitude with the first amplitude; and
 wherein the model is determined by performing operations, the operations comprising:
  applying a first calibration pulse;
  determining a first compensation adjustment to the second control pulse to compensate for the first calibration pulse;
  applying a second calibration pulse;
  determining a second compensation adjustment to the second control pulse to compensate for the second calibration pulse; and
  determining the model based at least in part on the first compensation adjustment and the second compensation adjustment, wherein determining the model based at least in part on the first compensation adjustment and the second compensation adjustment comprises performing an interpolation between the first compensation adjustment and the second compensation adjustment.

10. The quantum computing system of claim 9, wherein the second amplitude is determined to reduce an effect attributable to a settling time associated with the first control pulse during the second control pulse.

11. The quantum computing system of claim 9, wherein the first control pulse and the second control pulse are applied to the tunable coupler.

12. The quantum computing system of claim 9, wherein the interpolation is a liner interpolation.

13. The quantum computing system of claim 9, wherein the first calibration pulse has a positive amplitude and the second calibration pulse has a negative amplitude.

14. The quantum computing system of claim 9, wherein the first qubit and the second qubit are transmon qubits.

* * * * *